(12) United States Patent
Ju (10) Patent No.: US 8,048,745 B2
(45) Date of Patent: Nov. 1, 2011

(54) TRANSISTOR AND METHOD OF FABRICATING THE SAME

(75) Inventor: Chang Young Ju, Bucheon-si (KR)

(73) Assignee: Dongbu Hitek Co., Ltd., Seoul (KR)

(*) Notice: Subject to any disclaimer, the term of this patent is extended or adjusted under 35 U.S.C. 154(b) by 369 days.

(21) Appl. No.: 12/205,005

(22) Filed: Sep. 5, 2008

(65) Prior Publication Data

US 2009/0065865 A1    Mar. 12, 2009

(30) Foreign Application Priority Data

Sep. 7, 2007 (KR) .................. 10-2007-0090749

(51) Int. Cl.
    *H01L 21/336* (2006.01)
(52) U.S. Cl. ........ 438/282; 438/284; 438/300; 257/287; 257/344
(58) Field of Classification Search .......... 257/344, 257/E29.266, 287; 438/282, 284, 299, 300, 438/283, 291
    See application file for complete search history.

(56) References Cited

U.S. PATENT DOCUMENTS

| 5,578,513 | A | * | 11/1996 | Maegawa | 438/151 |
| 5,965,919 | A | * | 10/1999 | Yoo | 257/351 |
| 7,354,831 | B2 | * | 4/2008 | Orlowski | 438/283 |

FOREIGN PATENT DOCUMENTS

| KR | 10-0321757 | 1/2002 |
| KR | 10-2006-0069561 | 6/2006 |

OTHER PUBLICATIONS

English Machine translation of Korean Patent KR-10-0321757 assigned to KIm dated :Jan. 10, 2002 ( 10 pages ).*

* cited by examiner

*Primary Examiner* — Thinh T Nguyen
(74) *Attorney, Agent, or Firm* — Saliwanchik, Lloyd & Eisenschenk (57) ABSTRACT

Disclosed are a semiconductor device and a method of fabricating the same. The semiconductor device can include a transistor structure including a gate electrode and a first channel region and source/drain regions on a substrate, and a second channel region and source/drain regions provided on the transistor structure. Accordingly, transistor operations can utilize the current path above and below the gate electrode.

8 Claims, 8 Drawing Sheets

TRANSISTOR AND METHOD OF FABRICATING THE SAME

CROSS-REFERENCE TO RELATED APPLICATION

The present application claims the benefit under 35 U.S.C. §119 of Korean Patent Application No. 10-2007-0090749, filed Sep. 7, 2007, which is hereby incorporated by reference in its entirety.

BACKGROUND

In general, a metal oxide semiconductor (MOS) field effect transistor (hereinafter, referred to as 'MOSFET') has higher input impedance than a bipolar transistor so that the MOSFET has large power gain and includes a very simple gate driving circuit.

Also, since the MOSFET is a unipolar device, it has an advantage of having no time delay caused by accumulation and recombination due to minority carriers while the device is turned-off.

Also, the MOSFET has a structure including an oxide film and a gate poly formed on a semiconductor substrate and source/drain regions formed in the semiconductor substrate to the sides of the gate poly.

BRIEF SUMMARY

Embodiments of the present invention provide a semiconductor device and a method of fabricating the same, which can be driven at high speed.

A semiconductor device according to an embodiment can comprise: a gate electrode on a semiconductor substrate; first source/drain regions in the semiconductor substrate at sides of the gate electrode; a corresponding first channel region under the gate electrode between the first source/drain regions; and a second channel region formed on the gate electrode.

According to the embodiments, the semiconductor device includes a first channel region below a gate electrode and a second channel region above the gate electrode.

Accordingly, since the semiconductor device according to an embodiment has a double channel region, the semiconductor device can send a large amount of current to the first and second channel regions and can be driven at rapid speed.

DETAILED DESCRIPTION

Hereinafter, embodiments of a semiconductor device and method for manufacturing the same will be described with reference to the accompanying drawings.

Figure 1:
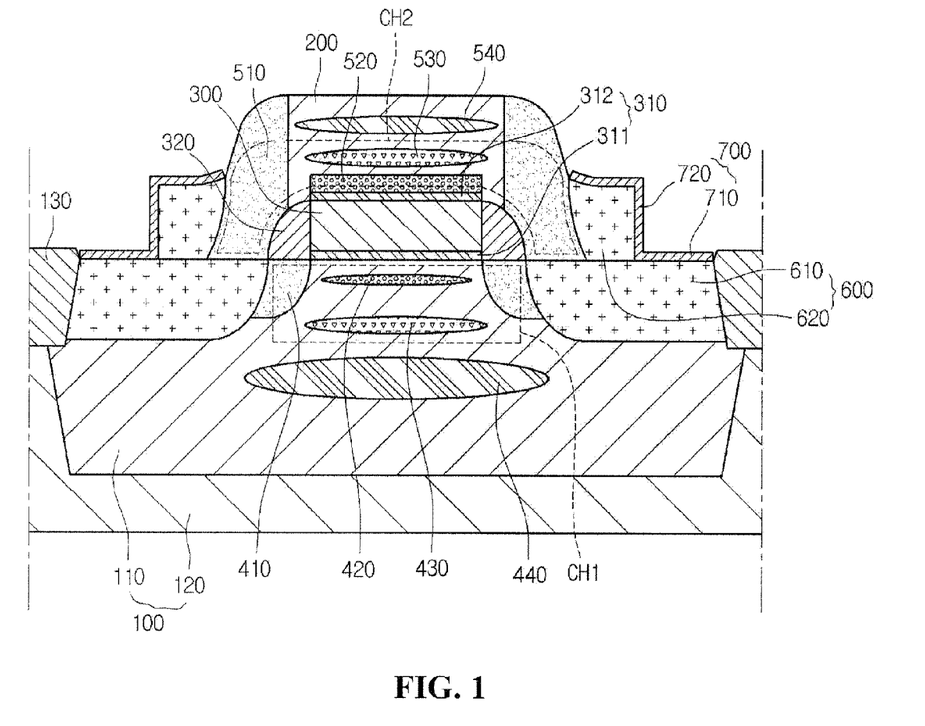
FIG. 1 is a cross-sectional view showing a transistor according to an embodiment.

Referring to FIG. 1, in an embodiment, a MOS transistor can include a gate electrode 300, a gate insulating layer 310, a second well region 200, source/drain regions 600, and channel regions CH1 and CH2. The MOS transistor can further include a gate spacer 320, punch implant regions 440 and 540, and a silicide layer 700. The MOS transistor can be formed on a semiconductor substrate 100.

The semiconductor substrate 100 can include a first well region 110 including P-type impurity and a region 120 including N-type impurity.

The gate electrode 300 can be arranged on the semiconductor substrate 100. The gate electrode 300 can be formed of any suitable material, for example, polycrystalline silicon (polysilicon).

The gate insulating layer 310 insulates the gate electrode 300. The gate insulating layer 310 can be formed of any suitable material, for example, a silicon oxide (e.g., $SiO_2$). The gate insulating layer 310 can include a first gate insulating layer 311 and a second gate insulating layer 312.

The first gate insulating layer 311 can be disposed between the gate electrode 300 and the semiconductor substrate 100.

The second gate insulating layer 312 can be disposed between the gate electrode 300 and the second well region 200.

The gate spacer 320 can be arranged at sides of the gate electrode 300. The gate spacer 320 can be formed of any suitable materials, for example, nitride. The gate spacer 320 insulates the sides of the gate electrode 300.

The second well region 200 can be arranged on the second gate insulating layer 312. The second well region 200 can include p-type impurity. In one embodiment, a concentration of the p-type impurity in the second well region 200 can be the same as a concentration of p-type impurity in the first well region 110.

Source/drain regions 600 can be formed at sides of the gate electrode 300. The source/drain regions 600 can include first source/drain regions 610 and second source/drain regions 620.

The first source/drain regions 610 can be formed with high-concentration N-type impurity in the first well region 110 at sides of the gate electrode 300.

The second source/drain regions 620 can be formed on the first source/drain regions 610. The second source/drain regions 620 can include high-impurity N-type impurity. For example, the concentration of the N-type impurity of the second source/drain regions 620 can be substantially the same as the concentration of the N-type impurity of the first source/drain regions 610.

The channel regions CH1 and CH2 include the first channel region CH1 and the second channel region CH2.

The first channel region CH1 is a region between the two first source/drain regions 610. In other words, the first channel region CH1 is arranged below the gate electrode 300 and the gate electrode 300 is arranged on the first channel region CH1.

The first channel region CH1 can include, for example, a first lightly doped drain (LDD) region 410, a first VT implant region 420, and a first channel implant region 430.

The first LDD regions 410 are provided spaced from each other and extend into the channel area between the two first source/drain regions 610. Also, the first LDD regions 410 are provided below the gate spacer 320. The first LDD region 410 can be formed with low-concentration N-type impurity.

The first LDD region 410 can be adjacent to the first source/drain region 610 in the substrate 100.

The first VT implant region 420 can be arranged below the gate electrode and at a region between the two first source/drain regions 610. The first VT implant region 420 can be formed by the implantation of N-type impurity at low concentration. The first VT implant region 420 can be used to lower threshold voltage during the operation of the subject transistor.

The first channel implant region 430 can be arranged below the first VT implant region 420. The first channel implant region 430 can have a concentration higher than that of the N-type impurity implanted into the first VT implant region 420.

The second channel region CH2 is a region between the second source/drain regions 620, and is formed on the gate electrode 300.

The second channel region CH2 can include a second LDD region 510, a second VT implant region 520, and a second channel implant region 530.

The second LDD region 510 can be formed corresponding to a region between the first source/drain regions 610 by the implantation of N-type impurity at low concentration. The second LDD regions 510 can be spaced from each other at opposite sides of the gate electrode 300.

The second VT implant region 520 can be formed in a polysilicon layer on the gate insulating layer 310 by the implantation of the N-type impurity. Alternatively, the second VT implant region 520 can be formed in a portion of the second well region 200. The second VT implant region 520 can be used to lower the threshold voltage of the subject transistor.

The second channel implant region 530 can be formed in a portion of the second well region 200 on the second VT implant region 520. The second channel implant region 530 can be formed by the implantation of N-type impurity having a higher concentration than that of the N-type impurity implanted into the second VT implant region 520.

The punch implant regions 440 and 540 can include N-type impurity. The punch implant regions 440 and 540 can be used to inhibit a punch-through phenomenon generated when the subject transistor is operated. The punch implant regions 440 and 540 can include the first punch implant region 440 and the second punch implant region 540.

The first punch implant region 440 can be formed below the first channel region CH1.

The second punch implant region 540 can be formed on the second channel region CH2.

The silicide layer 700 can include a first silicide layer 710 and a second silicide layer 720.

The first silicide layer 710 can be formed on the first source/drain regions 610. The first silicide layer 710 can be formed on a top surface of the first source/drain regions 610 not covered by the second source/drain regions 620.

The second silicide layer 720 can be formed on the second source/drain region 620. The second silicide layer 720 covers the top and side of the second source/drain regions 620.

The transistor according to embodiments can include a first channel region CH1 and a second channel region CH2, which can provide a higher operating speed than a transistor having only one channel region.

Therefore, the transistor according to an embodiment can be operated at low voltage, can send a large amount of current between the source/drain regions 600, and can have high speed characteristics.

A method of fabricating a semiconductor device according to an embodiment will be described with reference to FIGS. 2a to 2g.

Figure 2A:
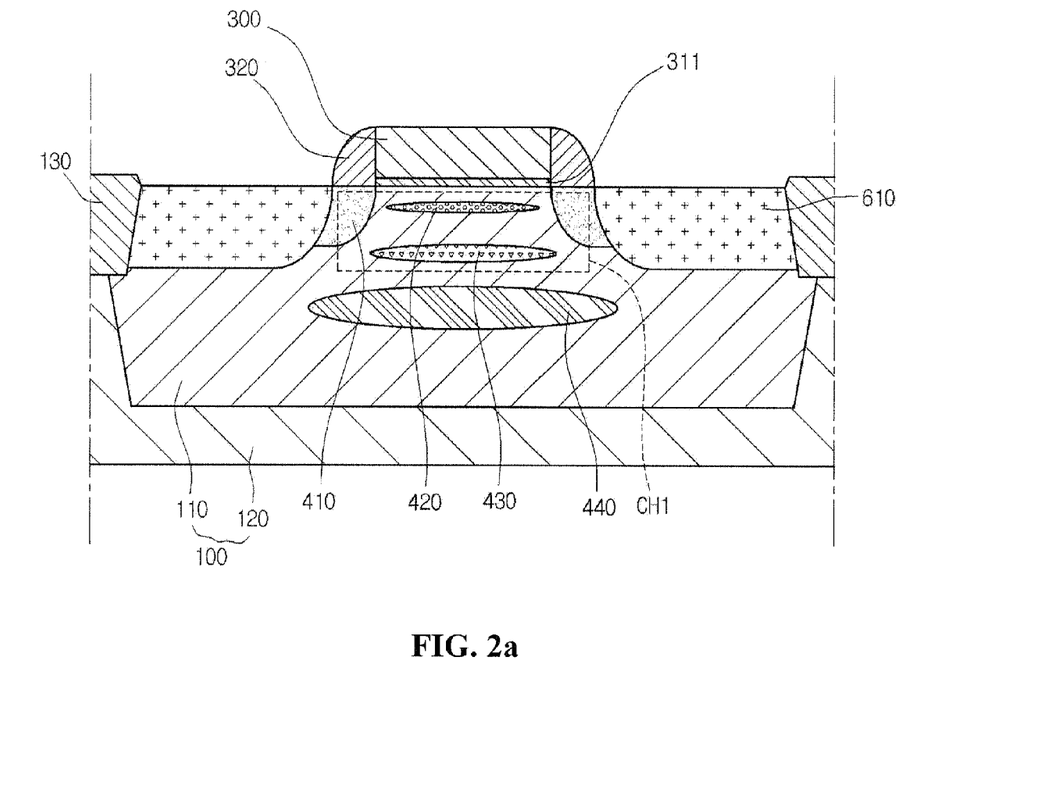
FIGS. 2a to 2g are cross-sectional views illustrating a method of fabricating a semiconductor device according to an embodiment.

Referring to FIG. 2a, a device isolating layer 130 can be formed in an N-type semiconductor substrate, and p-type impurity can be implanted into a region defined by the device isolating layer 130 to form a first well region 100. Accordingly, the semiconductor substrate 100, which includes the region 120 having the N-type impurity and the first well region 110 implanted with the P-type impurity, is formed.

Thereafter, N-type impurity can be implanted into a pre-determined region of the first well region 110 at a first depth to form a first punch implant region 440.

After the first punch implant region 440 is formed, N-type impurity can be implanted at a second depth shallower than the first depth to form a first channel implant region 430.

After the first channel implant region 430 is formed, N-type impurity can be implanted into the region 430 at a third depth shallower than the second depth to form a first VT implant region 420.

The first, second, and third depths can be controlled, for example, by using a difference in implantation energy for the N-type impurity.

Thereafter, an oxide film can be formed on the semiconductor substrate 100 through, for example, a thermal oxidation process and a polysilicon layer can be formed on the oxide film. Then, the polysilicon layer and the oxide film can be patterned by a mask process to form the gate electrode 300 and the first gate insulating layer 311.

After the gate electrode 300 and the first gate insulating layer 311 are formed, N-type impurity can be implanted at low concentration into the first well region 110 at the sides of the gate electrode 300 using the gate electrode 300 as a mask to form a first LDD region 410.

Then, an insulating material such as a silicon nitride film can be deposited on the structure. The silicon nitride film can be etched by an anisotropy etching process, such as an etch back process to form a gate spacer 320 on the sides of the gate electrode 300.

After the gate spacer 320 is formed, N-type impurity can be implanted into the first well region 110 at high concentration using the gate spacer 300 as a mask to form the first source/drain regions 610.

Accordingly, a first channel region CH1 can be defined between the two first source/drain regions 610

Figure 2B:
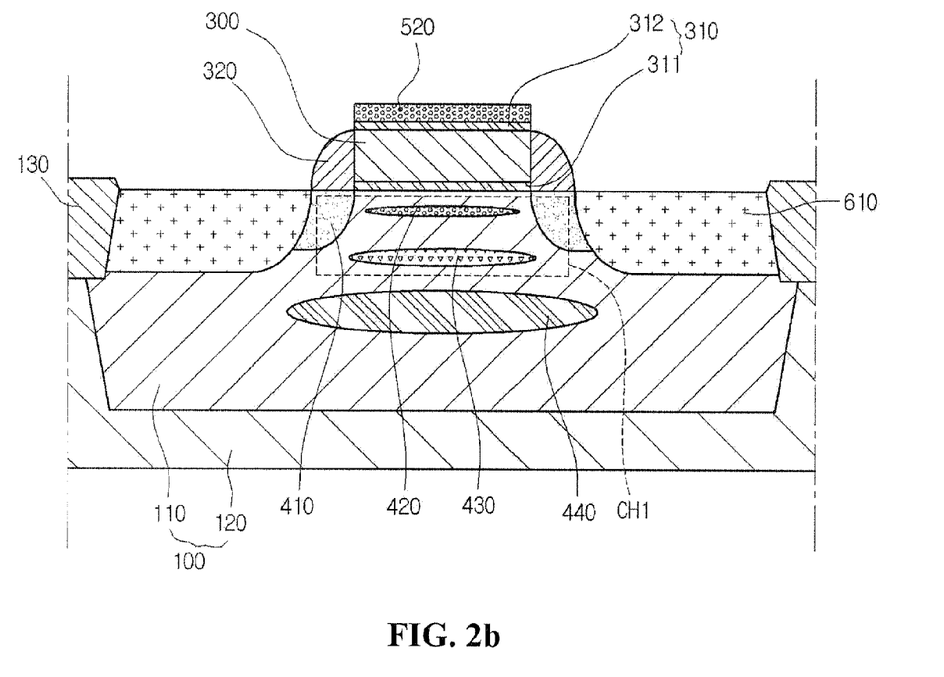

Referring to FIG. 2b, a second gate insulating layer 312 can be formed on the gate electrode 300.

In one embodiment, a protective layer can be formed on the substrate 100, exposing the upper surface of the gate electrode 300. Then, the second gate insulating layer 312 can be formed, for example, by a thermal oxidation process or a CVD process.

A polysilicon layer can be formed over the semiconductor substrate 100 and patterned by a mask process to remain on the second gate insulating layer. N-type impurity can be implanted at low concentration into the pre-patterned polysilicon layer to form a second VT implant region 520 on the gate electrode 300.

Figure 2C:
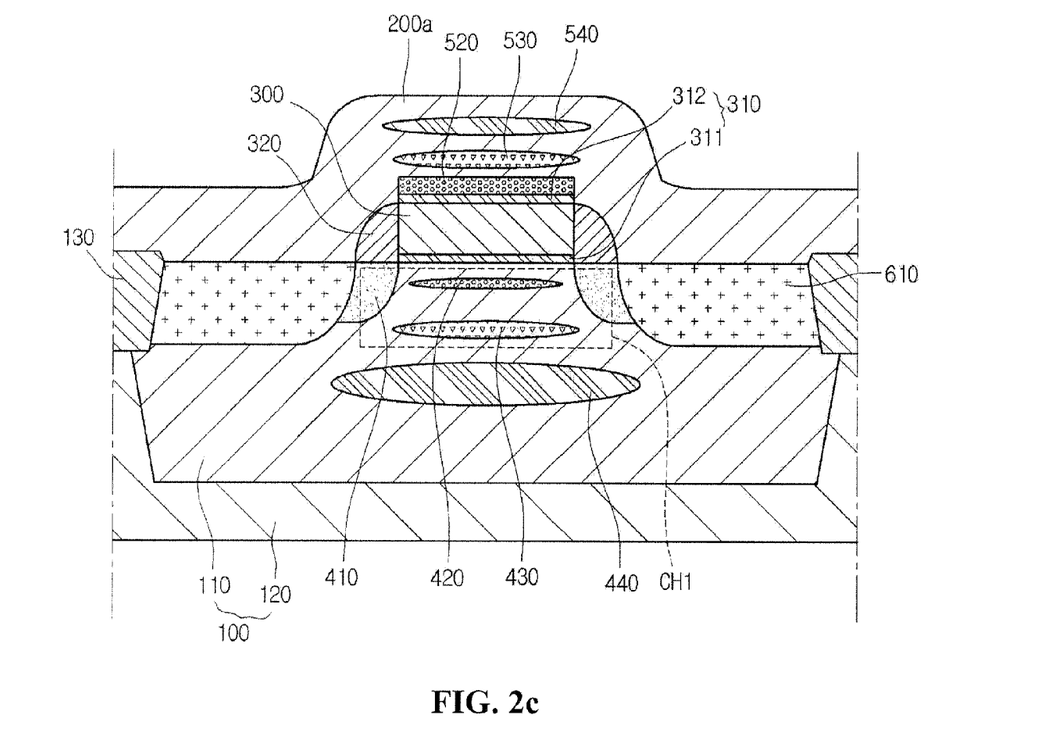

Referring to FIG. 2c, after the second VT implant region 520 is formed, a silicon layer can be formed over the semiconductor substrate 100. The silicon layer can be formed through a deposition process. P-type impurity can be implanted into the silicon layer to form a well layer 200a.

Thereafter, N-type impurity can be implanted into the well layer 200a at low concentration at a fourth depth to form a second channel implant region 530 on the second VT implant region 520. In addition, N-type impurity can be implanted into the well layer 200a at a fifth depth shallower than the fourth depth to form a second punch implant region 540 on the second channel implant region 530.

Figure 2D:
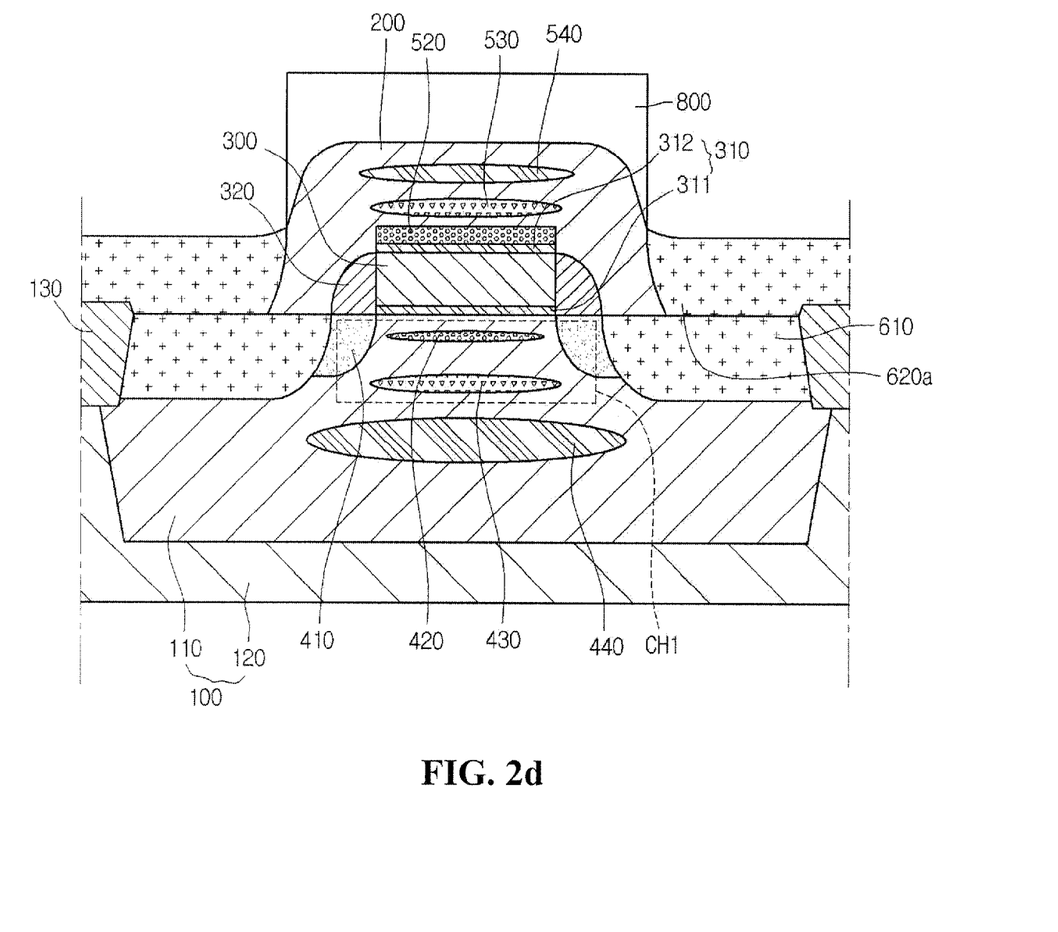

Referring to FIG. 2d, a first photoresist pattern 800 can be formed on the well layer 200a and N-type impurity can be implanted at high concentration using the first photoresist pattern 800 as a mask to form reserved second source/drain regions 620a. The two reserved second source/drain regions 620a are spaced a distance from a side of the gate electrode 300. The first photoresist pattern 800 can cover a first area over the gate electrode 300.

Figure 2E:
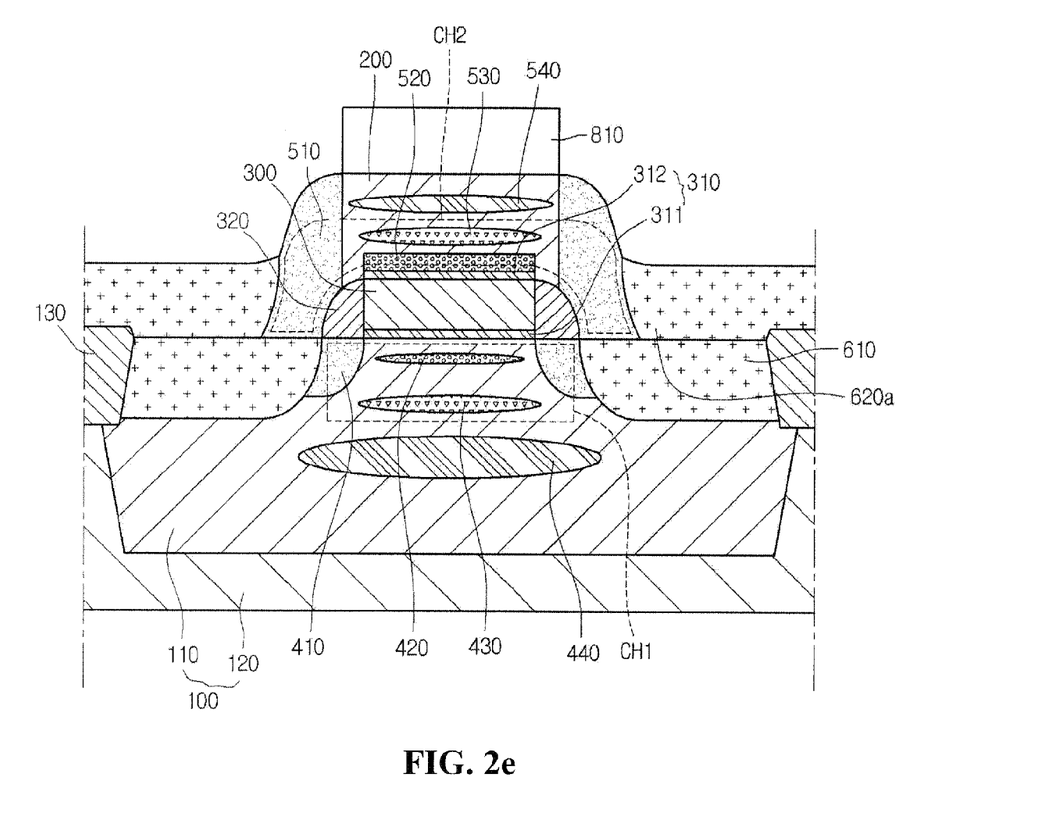

Referring to FIG. 2e, a second photoresist pattern 810 can be formed, and N-type impurity can be implanted at low concentration using the photoresist pattern 810 as a mask to form a second LDD region 510 in the well layer 200a. The second photoresist pattern 810 can cover a second area over the gate electrode 300 smaller than the first area.

Accordingly, a second channel region CH2 can be provided between the two reserved second source/drain regions 620a.

Figure 2F:
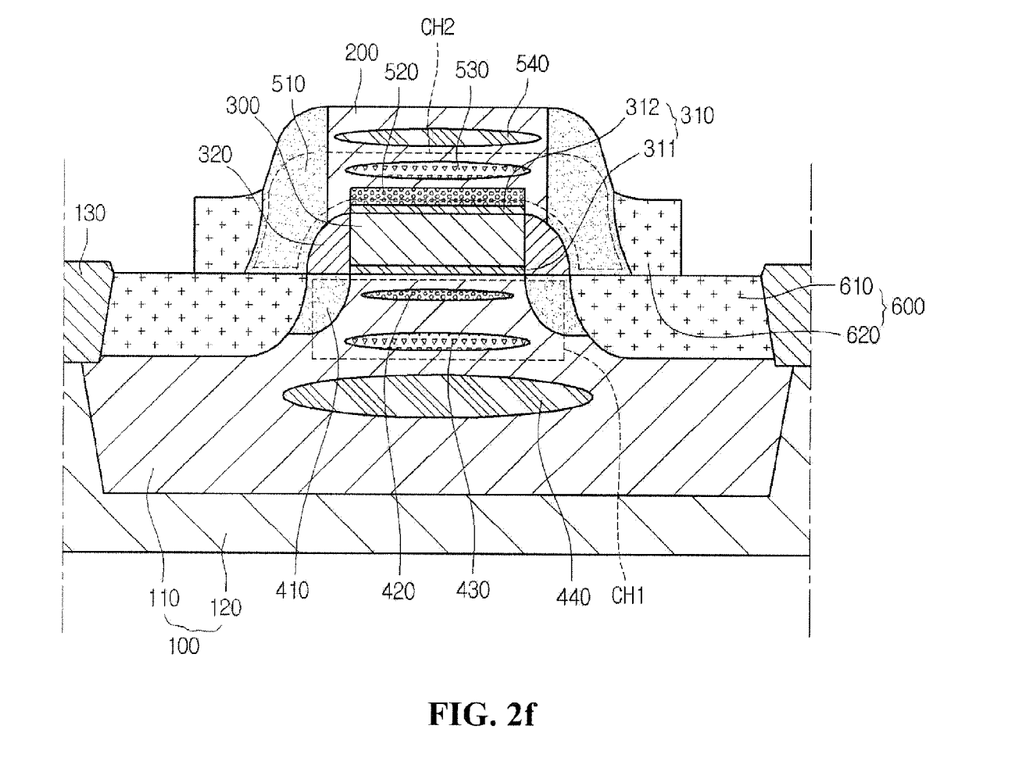

Referring to FIG. 2f, after the second LDD region 510 is formed, a portion of the reserved second source/drain region 620a can be etched to form second source/drain regions 620 on the first source/drain regions 610.

At this time, a portion of the first source/drain regions 610 can be exposed.

Figure 2G:
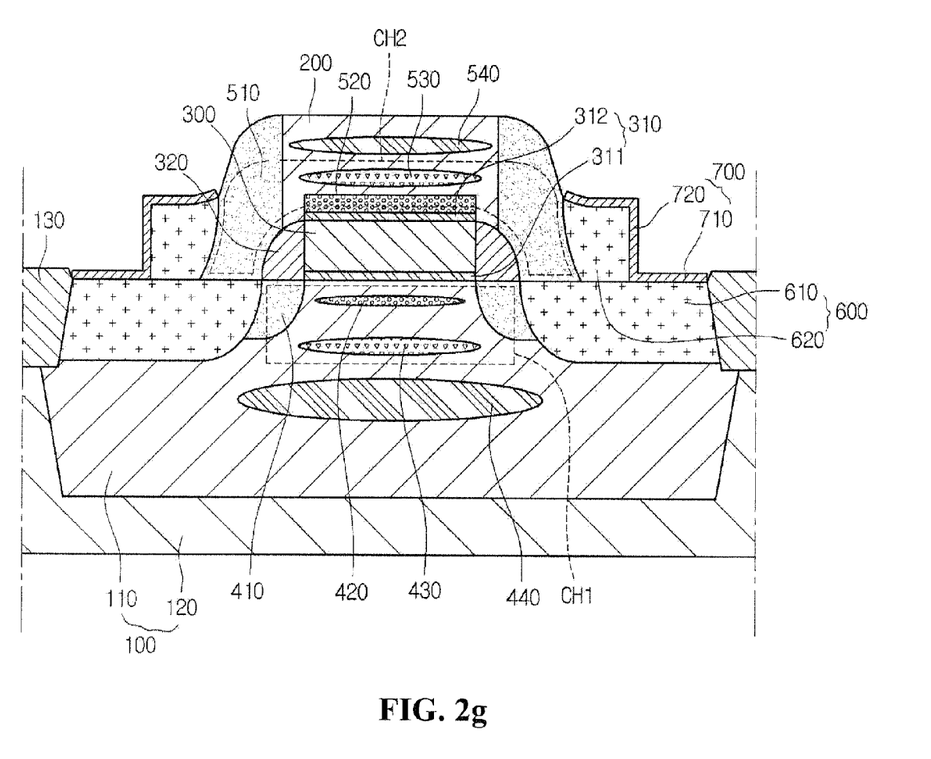

Referring to FIG. 2g, a silicide layer 700 can be formed on the exposed portion of the first source/drain regions 610 and on the second source/drain regions 620. In one embodiment, an oxide film exposing the first source/drain regions 610 and the second source/drain regions 620 can be formed on the substrate 100, and a metal layer can be formed. The metal layer can be any suitable material for forming a silicide, such as titanium, nickel, tantalum, or platinum.

Then, the semiconductor substrate 100 can be subject to a rapid heat treatment process such that the metal contacting the exposed source/drain regions 600 reacts. The unreacted metal layer can be removed. Also, the oxide film can be removed.

Thereafter, a wiring electrically connecting to the silicide layer 700 can be formed.

Although, the foregoing description makes reference to certain elements being p-type or n-type representing NMOS type transistors, embodiments are not limited thereto. For example, a PMOS type transistor can be provided within the principles of this disclosure.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a semiconductor device, comprising:

forming a gate electrode and a first gate insulating layer on a semiconductor substrate;

forming a first source/drain region in the semiconductor substrate to a side of the gate electrode;

forming a doped silicon layer covering the gate electrode; and forming a second source/drain region in the doped silicon layer on a portion of the first source/drain region: the method also comprising:

forming a second gate insulating layer on the gate electrode before forming the doped silicon layer, forming a polysilicon layer on the second gate insulating layer and implanting impurity ions into the polysilicon layer to provide a voltage threshold region on the second gate insulating layer before forming the doped silicon layer.

2. The method according to claim 1, further comprising:

forming a first LDD region by implanting impurity ions into the semiconductor substrate at low concentration using the gate electrode as a mask.

3. The method according to claim 1, further comprising forming spacers at sidewalls of the gate electrode, wherein forming the first source/drain region comprises implanting impurity ions into the semiconductor substrate at high concentration using the spacers as a mask.

4. The method according to claim 1, wherein forming the second source/drain region comprises:

forming a S/D pattern mask on the doped silicon layer covering a first area above the gate electrode;

implanting impurity ions at high concentration into the doped silicon layer using the S/D pattern mask as an implantation mask to form a reserved source/drain region; and etching a portion of the reserved source/drain region such that a portion of a top surface of the first source/drain region is exposed.

5. The method according to claim 4, further comprising forming a second LDD region in the doped silicon layer to a side of the gate electrode, wherein forming the second LDD region comprises:

forming an LDD pattern mask on the doped silicon layer covering a second area smaller than the first area of the S/D pattern mask; and implanting impurity ions at low concentration into the doped silicon layer using the LDD pattern mask as an implantation mask.

6. The method according to claim 1, further comprising forming a silicide layer on a top surface and side surface of the second source/drain region and on a top surface of the first source/drain region not covered by the second source/drain region.

7. The method according to claim 1, further comprising forming a channel implant region in a portion of the doped silicon layer above the gate electrode.

8. The method according to claim 1, further comprising forming a punch implant region in a portion of the doped silicon layer above the gate electrode.

\* \* \* \* \*